(12) United States Patent
Takashima et al.

(10) Patent No.: US 7,736,446 B2
(45) Date of Patent: Jun. 15, 2010

(54) METHOD FOR MANUFACTURING A LANTHANUM OXIDE COMPOUND

(75) Inventors: Akira Takashima, Fuchu (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 12/051,286

(22) Filed: Mar. 19, 2008

(65) Prior Publication Data

US 2009/0107586 A1   Apr. 30, 2009

(30) Foreign Application Priority Data

Oct. 31, 2007 (JP) ............................. 2007-284108

(51) Int. Cl.
*C23C 16/40* (2006.01)
(52) U.S. Cl. ............. 148/284; 427/255.32; 427/255.34; 427/126.3; 427/126.4; 117/103; 117/108
(58) Field of Classification Search ................. 148/284; 427/255.32, 126.3, 126.4, 596, 255.34; 117/92, 117/103, 108
See application file for complete search history.

(56) References Cited

U.S. PATENT DOCUMENTS

| | | | | |
|---|---|---|---|---|
| 4,738,946 A | * | 4/1988 | Yamashita et al. ........... 502/303 |
| 4,879,079 A | * | 11/1989 | Hsieh ........................... 264/86 |
| 5,055,169 A | * | 10/1991 | Hock et al. .................. 427/531 |
| 5,300,484 A | * | 4/1994 | Otani .......................... 505/473 |
| 5,470,668 A | * | 11/1995 | Wu et al. ..................... 428/688 |
| 5,478,610 A | * | 12/1995 | Desu et al. ................... 427/573 |
| 5,968,870 A | * | 10/1999 | Iizuka et al. ................ 502/325 |
| 6,156,630 A | * | 12/2000 | Iyer ............................. 438/585 |
| 6,235,402 B1 | * | 5/2001 | Shoup et al. ................ 428/472 |
| 6,440,575 B1 | * | 8/2002 | Heimberg et al. ........... 428/472 |
| 6,770,923 B2 | | 8/2004 | Nguyen et al. |
| 6,893,984 B2 | * | 5/2005 | Ahn et al. .................... 438/785 |
| 7,049,192 B2 | * | 5/2006 | Ahn et al. .................... 438/240 |
| 7,494,939 B2 | * | 2/2009 | Ahn et al. .................... 438/785 |
| 2005/0242387 A1 | * | 11/2005 | Forbes ......................... 257/314 |
| 2006/0179717 A1 | * | 8/2006 | LaBarge ..................... 48/127.9 |
| 2006/0257305 A1 | * | 11/2006 | Yang ........................... 423/263 |

OTHER PUBLICATIONS

Jing, F.J., et al., "Hemocompatibility of lanthanum oxide films fabricated by dual plasma deposition". Thin Solid Films 515 (2006) pp. 1219-1222.*

(Continued)

*Primary Examiner*—Bret Chen
(74) *Attorney, Agent, or Firm*—Oblon, Spivak, McClelland, Maier & Neustadt, L.L.P.

(57) ABSTRACT

A method for manufacturing a lanthanum oxide compound on a substrate includes: setting the number of $H_2O$ molecule, the number of CO molecule and the number of $CO_2$ molecule to one-half or less, one-fifth or less and one-tenth or less per one lanthanum atom, respectively, the $H_2O$ molecule, the CO molecule and the $CO_2$ molecule being originated from an $H_2O$ gas component, a CO gas component and a $CO_2$ gas component in an atmosphere under manufacture; and supplying a metal raw material containing at least one selected from the group consisting of lanthanum, aluminum, titanium, zirconium and hafnium and an oxygen raw material gas simultaneously for the substrate under the condition that the number of $O_2$ molecule are set to 20 or more per one lanthanum atom, thereby manufacturing the lanthanum oxide compound on the substrate.

12 Claims, 8 Drawing Sheets

OTHER PUBLICATIONS

Wu, X., et al., "Characterization of gadolinium and lanthanum oxide films on Si (100)". J. Vac. Sci. Technol. A 20(3), May/Jun. 2002 pp. 1141-1144.*

Nieminen, Minna, et al., "Formation and stability of lanthanum oxide thin films deposited from B-diketonate precursor". Applied Surface Science 174 (2001) pp. 155-165.*

Song, Jaeyeol, et al., "Characteristics of Ultrathin Lanthanum Oxide Films on Germanium Substrate: Comparison with Those on Silicon Substrate". Japanese Journal of Applied Physics, vol. 46, No. 16, 2007, pp. L376-L378.*

Gougousi, Theodosia, et al., "Properties of La-silicate high-K dielectric films formed by oxidation of La on silicon". Journal of Applied Physics, vol. 93, No. 3, Feb. 1, 2003, pp. 1691-1696.*

Lim, Booyong, et al., "Atomic layer deposition of lanthanum aluminum oxide nano-laminates for electrical applications". Applied Physics Letters, vol. 84, No. 20, May 17, 2004, pp. 3957-3959.*

Kukli, Kaupo, et al., "Atomic Layer Deposition and Properties of Lanthanum Oxide and Lanthanum-Aluminum Oxide Films". Chemical Vapor Deposition, 2006, 12, pp. 158-164.*

Yasuo Nara, "Metal Gate, high-k gate stack technology for advanced CMOS", Ouyoubutsuri, vol. 76, No. 9, 2007, pp. 1006-1012.

* cited by examiner

METHOD FOR MANUFACTURING A LANTHANUM OXIDE COMPOUND

CROSS-REFERENCE TO RELATED APPLICATIONS

This application is based upon and claims the benefit of priority from the prior Japanese Patent Application No. 2007-284108, filed on Oct. 31, 2007; the entire contents of which are incorporated herein by reference.

BACKGROUND OF THE INVENTION

1. Field of the Invention

The present invention relates to a method for manufacturing a lanthanum oxide compound which can exhibit satisfactory electrical insulation and high dielectric constant.

2. Description of the Related Art

As of now, oxide silicon films or oxynitride silicons would be employed as gate insulating films of MOSFETs (Metal Oxide Semiconductor Field Effect Transistors) in a semiconductor integrated circuit or insulating films for electrodes of memory cells in a FLUSH memory. With the recent requirement of the downsizing of the MOSFET and the memory cell, it is also intensely required to reduce the thickness of the gate insulating film and the thickness of the insulating film (e.g., blocking oxide). In this point of view, it may be that the oxide silicon film and the oxyitride silicon film can not maintain the insulation requiring for the gate insulating film and the insulating film. Therefore, such an attempt is made as replacing the conventional oxide silicon film and oxynitride silicon film with a new insulating material which can be reduced in thickness while the electrical insulation can be maintained sufficiently. Since lanthanum oxide compound such as lanthanum aluminate (LAO) and lanthanum hafnate (LHO) has high dielectric constant and large bandgap, the lanthanum oxide is promising as the newly replacing material (Reference 1).

In order to utilize the lanthanum oxide industrially, it is required to develop a new film forming method and a film forming apparatus which can realize mass production. Generally, some CVD (Chemical Vapor Deposition) methods would be employed in the film forming steps in the production line of a semiconductor manufacturing process. However, since the vapor pressure of the lanthanum is very low, it may be difficult to form the lanthanum oxide compound film by means of CVD method. In this point of view, it is considered that the lanthanum oxide compound film is preferably formed by means of PVD (Physical Vapor Deposition) method instead of the CVD method (Reference 2).

An MBE (Molecular Beam Epitaxy) method can be exemplified as the PVD method. The MBE can exhibit good performances such as the easy controllability in supplying rate of raw materials and low damage for a substrate during the supply of the raw materials in comparison with a sputtering method and the like.

In the case that an oxide film is formed by means of the MBE method, a metal raw material and an oxygen raw material are supplied simultaneously. For example, the lanthanum oxide (LAO) compound film can be formed by supplying an aluminum raw material, a lanthanum raw material and an oxygen raw material simultaneously for the intended substrate. However, there are some problems in the formation of the lanthanum oxide compound film by means of the MBE method as follows.

In the case that the supplying rate of the lanthanum raw material is so high that the intended oxidation cannot be realized, some oxide defects may be generated in the resultant lanthanum oxide compound film. In contrast, it is desired to increase the supplying rate of the lanthanum raw material in mass production while the oxygen defects of the lanthanum oxide compound film may deteriorate the inherent electrical insulation thereof. As a result, the lanthanum oxide film may not be formed so as to realize the electrical insulation as designed initially.

[Reference 1] J. Appl. Phys. Vol. 76, No. 9, 1006 (2007), Yasuo Nara

[Reference 2] U.S. Pat. No. 6,770,923

BRIEF SUMMARY OF THE INVENTION

An aspect of the present invention relates to a method for manufacturing a lanthanum oxide compound on a substrate, including: setting the number of $H_2O$ molecule, the number of CO molecule and the number of $CO_2$ molecule to one-half or less, one-fifth or less and one-tenth or less per one lanthanum atom, respectively, in an atmosphere; and supplying a lanthanum raw material, a metal raw material containing at least one selected from the group consisting of aluminum, titanium, zirconium and hafnium.

DETAILED DESCRIPTION OF THE INVENTION

Figure 1:
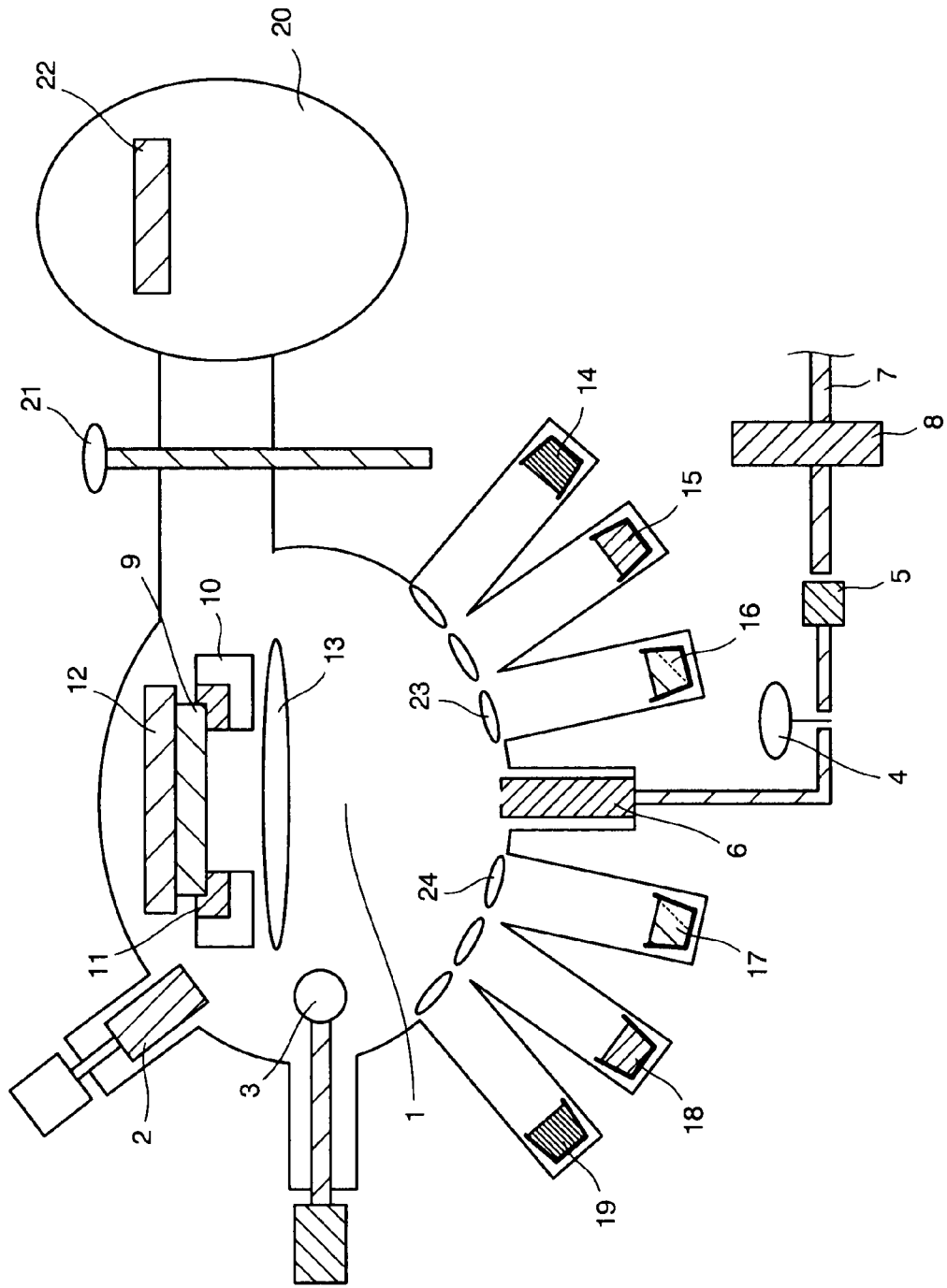
FIG. 1 is a schematic structural view showing an MBE apparatus to be employed in an embodiment.

Hereinafter, the present invention will be described in detail with reference to the drawings. FIG. 1 is a schematic structural view showing an MBE apparatus to be employed according to the manufacturing method in this embodiment. The MBE apparatus shown in FIG. 1 is exemplified so that the manufacturing method in this embodiment is not restricted to the illustrated MBE apparatus and thus, another MBE apparatus may be employed.

Since the vapor pressure of a lanthanum raw material, which is a main component in the intended lanthanum oxide compound film, is very low, the vapor pressure of the lanthanum raw material can be increased to some degrees by the MBE apparatus. In this point of view, the intended lanthanum oxide compound film can be formed effectively and efficiently for a short time according to the MBE apparatus. Moreover, the supplying rates of the raw materials of the intended lanthanum oxide compound film can be easily controlled and the damage for the substrate during the supply of the raw materials can be reduced according to the MBE apparatus in comparison with a sputtering apparatus and the like.

In the MBE apparatus shown in FIG. 1, a film forming chamber 1 is disposed at almost the center of the MBE apparatus so that the inside of the film forming chamber 1 is vacuum-evacuated by means of a vacuum pump such as a turbo-molecular pump (not shown). A holder 10 for holding a substrate 9 is provided in the film-forming chamber 1, and a heater 12 for heating the substrate 9 to a predetermined temperature is provided in the rear side of the substrate 9.

A rotating mechanism (not shown) is attached to the holder 10 so as to maintain the thickness uniformity of the intended lanthanum oxide compound film over the substrate 9. The rotating mechanism can be configured to be rotated on and around its axis. In this case, the thickness uniformity of the intended lanthanum oxide compound film can be enhanced. Then, a shutter 13 is disposed over the substrate 9 so as to start and stop the supply of the raw materials.

In this embodiment, the holder 10 is made of Inconel. The Inconel is a transition metal alloy made of iron, chromium, niobium, molybudenum and the like and can exhibit high resistance against oxygen. As described below, therefore, even though a relatively large amount of oxygen is supplied, the corrosion of the holder 10 due to the oxygen can be suppressed so that the lifetime of the holder 10 can be elongated.

In this embodiment, the holding portions 11 of the holder 10 contacted with the substrate 9 can be made of at least one of aluminum oxide and silicon oxide. In the case that the holder 10 is made of the Inconel, if the substrate 9 is a semiconductor substrate such as a silicon substrate, the elemental chromium of the Inconel may be incorporated into the semiconductor substrate to some degrees so as to form a deep impurity level and thus, deteriorate the properties of the semiconductor substrate. However, if the holding portions 11 are made of aluminum oxide and the like as described above, the above-described disadvantages of the deterioration in property of the semiconductor substrate can be removed.

The holder portions 11 may be covered with the films made of aluminum oxide and the like, instead of being directly formed by aluminum oxide and the like.

That the holder 10 is made of the Inconel is not essential in this embodiment. Also, that the holding portions 11 are made of aluminum oxide and the like is not essential in this embodiment. The intended lanthanum oxide compound film can be formed at high yield ratio according to the inherent manufacturing method in this embodiment as described below.

Then, a quadrupole mass spectrometer 2 for measuring the partial pressures of gases remaining in the film forming chamber 1 is disposed in the vicinity of the substrate 9 (holder 10) in the film forming chamber 1. Then, a film thickness meter 3 of crystal oscillator type for measuring the supplying rate of the metal raw material from the corresponding metal raw material source is also disposed in the vicinity of the substrate 9 (holder 10) in the film forming chamber 1.

Then, the raw material sources for forming the intended lanthanum oxide compound film are disposed opposite to the substrate 9 in the film forming chamber 1. As shown in FIG. 1, concretely, Knudsen cells (K-cells) 14, 15, 16 and electron beam deposition sources 17, 18, 19 are disposed clockwise. For example, the lanthanum raw material is set in the K-cell 14, and the titanium raw material is set in the K-cell 15, and the aluminum raw material is set in the K-cell 16. Then, the hafnium raw material is set in the electron beam deposition source 17, and the zirconium raw material is set in the electron beam deposition source 18, and the lanthanum raw material is set in the electron beam deposition source 19.

In this embodiment, the hafnium raw material and the zirconium raw material are set in the electron beam deposition sources because the melting points of the hafnium raw material and the zirconium raw material are very high so that the vapor pressures of the hafnium raw material and the zirconium raw material may become very low only through the heating for the K-cells and thus, the intended lanthanum oxide compound film can not be formed. Moreover, in this embodiment, the lanthanum raw material is set in the K-cell and the electron beam deposition source so that the vapor pressure of the lanthanum raw material can be controlled freely within a wide range and thus, the intended lanthanum oxide film can be formed effectively and efficiently.

Then, shutters 23 are provided over the openings of the K-cells, respectively, and shutters 24 are provided over the openings of the electron beam deposition sources, respectively. The supply of each raw material can be started and stopped by opening and closing the corresponding shutter.

In this embodiment, the crucibles of the K-cells 14 and 15 are made of tantalum and the crucible of the K-cell 16 is made of Pyrolitic Boron Nitride (PBN). The PBN contains a small amount of impurity, and can exhibit high thermal conductivity and high resistance to acid.

The K-cell 16 is configured such that the opening is narrowed to be an orifice so as to maintain the supply quantity of the aluminum raw material constant with time. Alternatively, the temperature of the opening of the K-cell 16 may be set higher than the temperature of the bottom portion of the K-cell 16. In this case, the supply quantity of the aluminum raw material can be maintained constant as described above. In the latter case, the temperature of the opening of the K-cell 16 may be set within a range of 990 to 1000° C. and the temperature of the bottom portion of the K-cell 16 may be set within a range of 970 to 980° C.

In the former case, since the opening of the K-cell is configured as the orifice, only the aluminum raw material passed through the central area of the K-cell can be obtained via the orifice irrespective of the deposition of the aluminum raw material at the opening of the K-cell so that the supply quantity of the aluminum raw material can be maintained constant. In the later case, since the opening of the K-cell is heated to a predetermined temperature, the deposition at the opening of the K-cell is melted and removed so as to maintain the opening surface of the K-cell so that the supply quantity of the aluminum raw material can be maintained constant.

Then, an oxygen raw material source (not shown) is provided between the K-cells 14 to 16 and the electron beam deposition sources 17 to 19. The oxygen raw material is supplied to an ozone generator 8 from the oxygen raw material source via a tube 7. In this case, the oxygen raw material is converted into an ozone raw material, and then, supplied into the film forming chamber 1, that is, to the substrate 9 via an oxygen valve 4. Alternatively, the oxygen raw material is supplied to an oxygen radical source 6 through the ozone generator 8. In this case, the oxygen raw material is converted into an oxygen radical raw material, and then, supplied into the film forming chamber 1, that is, to the substrate 9 via an oxygen valve 4.

The flow rate of the oxygen raw material (ozone raw material) is controlled at a mass flow controller 5 provided at the midpoint of the tube 7.

Then, a preparation chamber 20 is provided for the film forming chamber 1 so that the inside of the film forming chamber 1 is roughly evacuated by the preparation chamber 20. In this case, the inside of the film forming chamber 1 can be easily maintained under the condition of high degree of vacuum. Without the preparation chamber 20, long period evacuation process and baking process are required so as to realize the high degree of vacuum and thus, to deteriorate the yield ratio of the intended lanthanum oxide compound film. In this embodiment, only the preparation chamber 20 is provided, but another chamber may be provided in addition to the preparation chamber 20. Namely, a plurality of preparation chambers may be provided.

Moreover, a heater 22 for degassing the substrate 9 is provided in the preparation chamber 20. Then, a gate valve 21 is provided between the film forming chamber 1 and the preparation chamber 20 so that the substrate 9 can be transferred between the film forming chamber 1 and the preparation chamber 20 by opening and closing the gate valve 21.

Then, the method for manufacturing the intended lanthanum oxide compound film using the MBE apparatus shown in FIG. 1 will be described. In this case, the method for manufacturing a lanthanum aluminate (LAO) as a typical one of the lanthanum oxide compound film will be described. The lanthanum raw material and the aluminum raw material are set in the K-cells 14 and 16, respectively. The substrate 9 is set to an n-type Si substrate.

First of all, the temperatures of the K-cells 14 and 16 are set to the prescribed temperatures, respectively, and then, kept for the prescribed period of time until the temperatures of the crucibles of the K-cells 14 and 16 can be set constant entirely. Then, the shutters 23 are opened so that the lanthanum raw material and the aluminum raw material are supplied to the substrate 9. In this case, the supplying rates of the lanthanum raw material and the aluminum raw material are measured by the film thickness meter 3 of crystal oscillator type. For example, the supplying rate of the lanthanum raw material to the supplying rate of the aluminum raw material is set to "1" (i.e., the supplying rate of the lanthanum raw material: the supplying rate of the aluminum raw material=1:1).

The Si substrate is treated by dilute hydrofluoric acid as normal so as to realize the hydrogen termination of the surfaces of the Si substrate, and then, introduced into the preparation chamber 20. After the degree of vacuum in the preparation chamber 20 reaches the prescribed degree of vacuum, the Si substrate 9 is heated by the degassing heater 22 provided in the preparation chamber 20. The heating process using the degassing heater 22 is performed so as to degas the moisture ($H_2O$) absorbed at the Si substrate 9 at a temperature of 100° C. or over. The upper limited temperature in the heating process is not restricted, but may be set to 400° C.

After the degassing process, the Si substrate 9 is transferred into the film forming chamber 1 via the gate valve 21, and mounted on the holder 10. Then, the Si substrate 9 is heated to a predetermined temperature as occasion demands so that the hydrogen molecules absorbed on the (100) surface of the Si substrate 9 can be released and thus, the (100) surface of the Si substrate 9 can be cleaned. The heating process may be carried out within a temperature range of 400 to 800° C. for 1 to 60 minutes, for example.

The cleaned (100) surface of the Si substrate 9 can be observed in situ by means of RHEED (Reflection High Energy Electron Diffraction), LEED (Low Energy Election Diffraction) or S™ (Scanning Tunneling Microscopy).

Then, the K-cell shutters 22 and the substrate shutter 9 are opened simultaneously so that the lanthanum raw material, the aluminum raw material and the oxygen raw material are supplied to the surface of the Si substrate 9. In this way, the intended LAO film can be formed. In this case, it is required that the number of $H_2O$ molecule, the number of CO molecule and the number $CO_2$ molecule are set to one-half or less, one-fifth or less and one-tenth or less per one lanthanum atom, respectively, in the atmosphere under the film forming process. Moreover, it is also required that the number of $O_2$ molecule in the oxygen raw material to be supplied to the Si substrate 9 is set to 20 or more per one lanthanum atom in the atmosphere under the film forming process. As a result, the intended LAO film (i.e., the lanthanum oxide compound film) with high electrical insulation due to the intended dielectric constant can be manufactured stably at high yield ratio.

In order to realize the requirement that the number of $H_2O$ molecule, the number of CO molecule and the number of $CO_2$ molecule are set to one-half or less, one-fifth or less and one-tenth or less per one lanthanum atom, respectively, in the atmosphere under the film forming process, the film forming chamber 1 may be baked in advance, and/or the lanthanum raw material and the aluminum raw material may be degassed in the K-cells 14 and 16 in advance.

If the metallic lanthanum atoms in the lanthanum raw material, which are not reacted with the $O_2$ molecules in the oxygen raw material, are reacted with the $H_2O$ molecules, the CO molecules and the $CO_2$ molecules remaining in the atmosphere under the film forming process, a lanthanum hydroxide compound and/or a lanthanum carbonate compound may be generated. Since the dielectric constants of the lanthanum hydroxide compound and the lanthanum carbonate compound are low, the dielectric constant of the lanthanum oxide compound film may be decreased undesirably if a large amount of lanthanum hydroxide and/or lanthanum carbonate is incorporated into the lanthanum oxide compound film. However, if the above-described requirement relating to the number of $H_2O$ molecule, the number of CO molecule and the number of $CO_2$ molecule is satisfied, the generation of the lanthanum hydroxide and the lanthanum carbonate can be suppressed so as to prevent the reduction in dielectric constant of the lanthanum oxide compound film.

The degassing process related to the above-described requirement about the number of $H_2O$ molecule, the number of CO molecule and the number of $CO_2$ molecule is carried out by heating the lanthanum raw material and the aluminum raw material in the K-cells to respective prescribed temperatures slightly lower than the respective supplying temperatures thereof. For example, the degassing process for the aluminum raw material may be carried out within a temperature range of 800 to 1200° C. and the degassing process for the lanthanum raw material may be carried out within a temperature range of 900° C. or over, preferably 1200 to 1400° C. The period of the degassing process depends on the amounts of $H_2O$ molecule, CO molecule and $CO_2$ molecule contained in the lanthanum raw material and the aluminum raw material, but normally set in the order of several hours to several days. Particularly, since the lanthanum is a lanthanoid, the lanthanum raw material absorbs a large amount of $O_2$ molecule even though the lanthanum raw material is kept in atmosphere. In this point of view, in order to realize the above-described requirement about the number of $H_2O$ molecule, the number of CO molecule and the number of $CO_2$ molecule, the degassing process for the lanthanum raw material is important. The degassing temperature of the lanthanum raw material is very high beyond expectation and then, found out through the intense research and development by the inventors.

The above-described requirement that the number of $O_2$ molecule in the oxygen raw material is set to 20 or more per one lanthanum atom in the atmosphere under the film forming process can be realized by controlling the supply quantity of the oxygen raw material from the oxygen raw material source with the mass flow controller 5.

The above-described requirement related to the number of $H_2O$ molecule, the number of CO molecule and the number of $CO_2$ in the atmosphere under the film forming process and the above-described requirement related to the number of $O_2$ molecules in the oxygen raw material for manufacturing the lanthanum oxide compound film with high electrical insulation due to the intended dielectric constant at high yield ratio can be clarified from the following Examples.

EXAMPLES

Table 1 lists the supplying rates of the lanthanum raw material and the aluminum raw material and the $O_2$ partial pressure in Experimental Examples 1 to 4. Herein, the $O_2$ partial pressure was measured by the quadrupole mass spectrometer 3.

TABLE 1

Supplying rate of lanthanum raw material and aluminum raw material and $O_2$ partial pressure

| $O_2$ partial pressure [Torr] | Supplying rate of lanthanum raw material and aluminum raw material [$cm^{-2} \cdot s^{-1}$] | No, |
|---|---|---|
| $5 \times 10^{-7}$ | $1 \times 10^{13}$ | Experimental Example 1 |
| $3 \times 10^{-7}$ | $1 \times 10^{13}$ | Experimental Example 2 |
| $5 \times 10^{-7}$ | $6 \times 10^{12}$ | Experimental Example 3 |
| $3 \times 10^{-7}$ | $6 \times 10^{12}$ | Experimental Example 4 |

Then, the $H_2O$ partial pressure, the CO partial pressure and the $CO_2$ partial pressure were $1\times10^{-8}$ Torr, $5\times10^{-9}$ Torr and $3\times10^{-9}$ Torr, respectively. The $H_2O$ partial pressure, the CO partial pressure and the $CO_2$ partial pressure were also measured by the quadrupole mass spectrometer 3.

Figure 2:
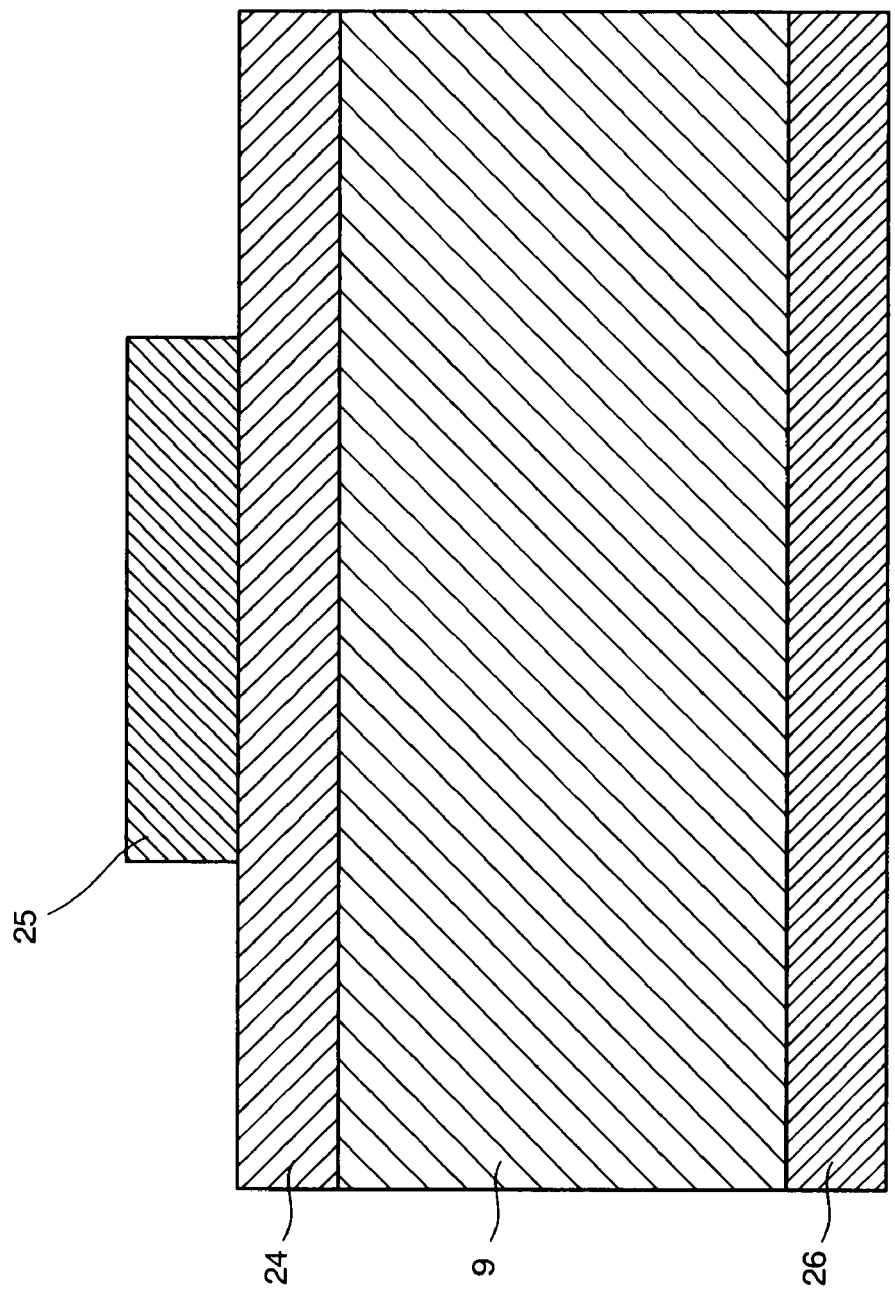
FIG. 2 is a schematic structural view showing a MIS capacitor in an Example.

After the formation of the LAO film through the film forming process as described above, the Si substrate 9 with the LAO film 24 thereon was transferred into the preparation chamber 20 from the film forming chamber 1 by conveying the holder 10 into the preparation chamber 20 from the film forming chamber 1. Then, the Si substrate 9 with the LAO film 24 was taken out of the preparation chamber 20. Then, a MIS (Metal-Insulator-Semiconductor) capacitor was fabricated using the LAO film 24. FIG. 2 is a schematic structural view of the MIS capacitor. As apparent from FIG. 2, the molybdenum electrode 25 was formed on the LAO film 24 by means of electron beam deposition and the aluminum electrode 26 was formed on the rear surface of the Si substrate 9 by means of resistance heating deposition.

Figure 3:
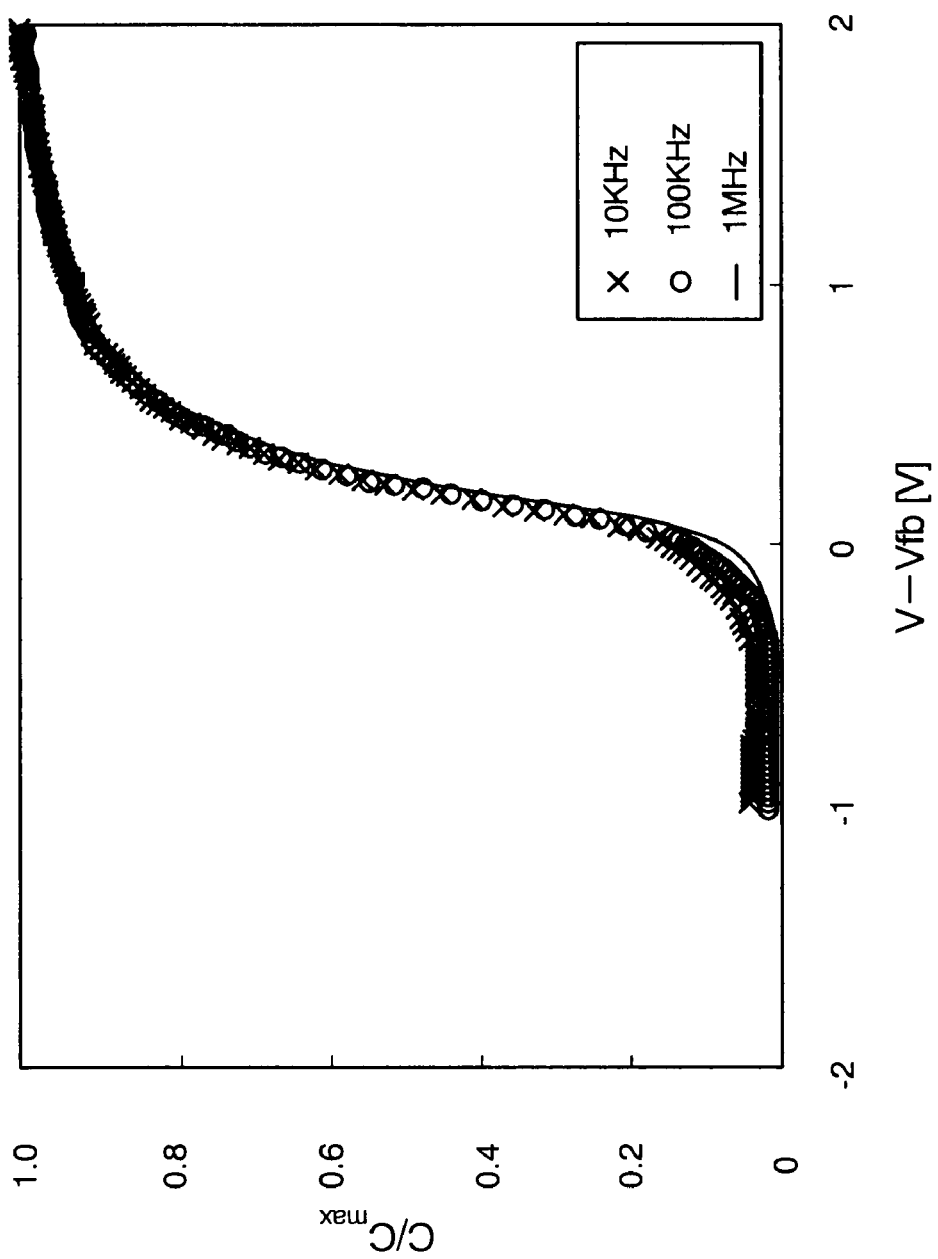
FIG. 3 is a graph showing the capacitance-voltage characteristic of the MIS capacitor in the Example.
Figure 4:
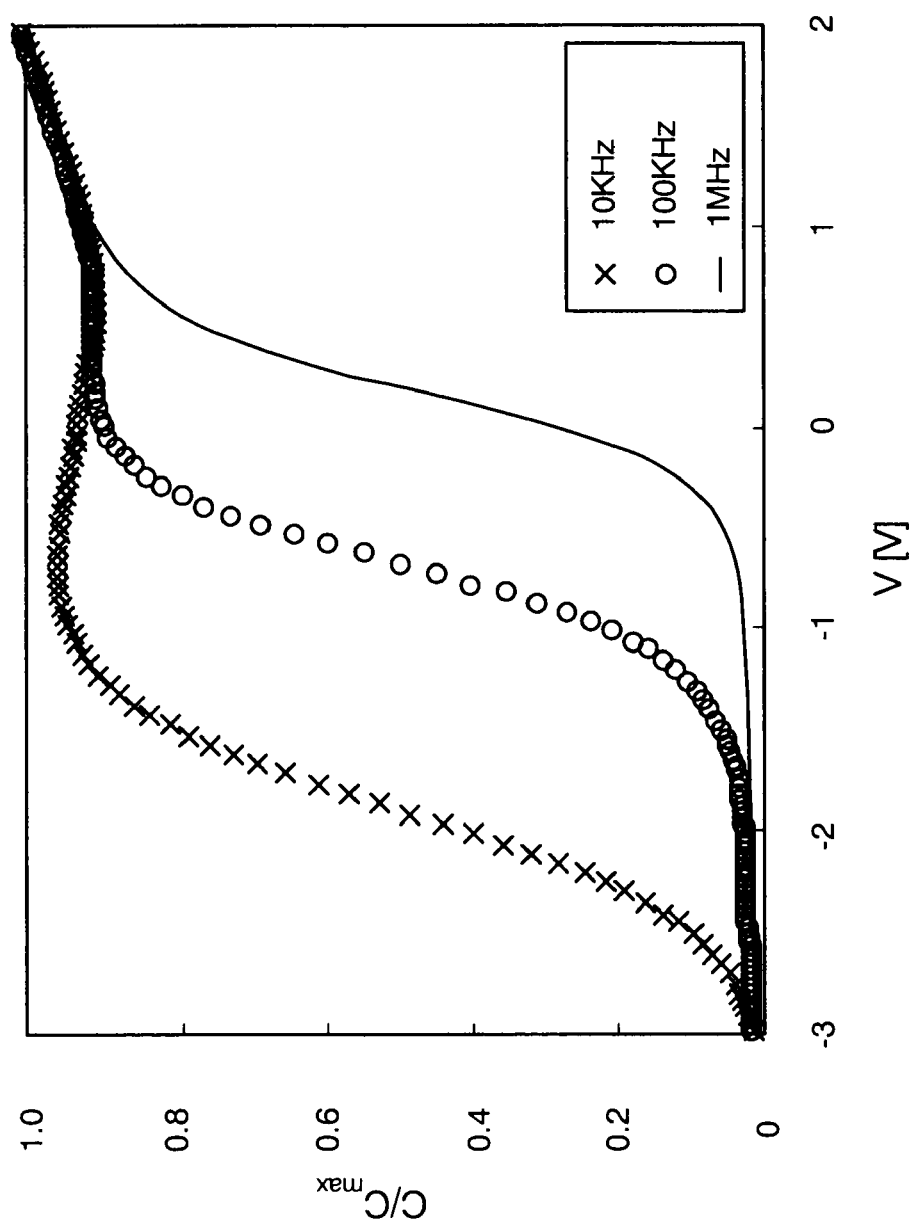
FIG. 4 is also a graph showing the capacitance-voltage characteristic of the MIS capacitor in the Example.
Figure 5:
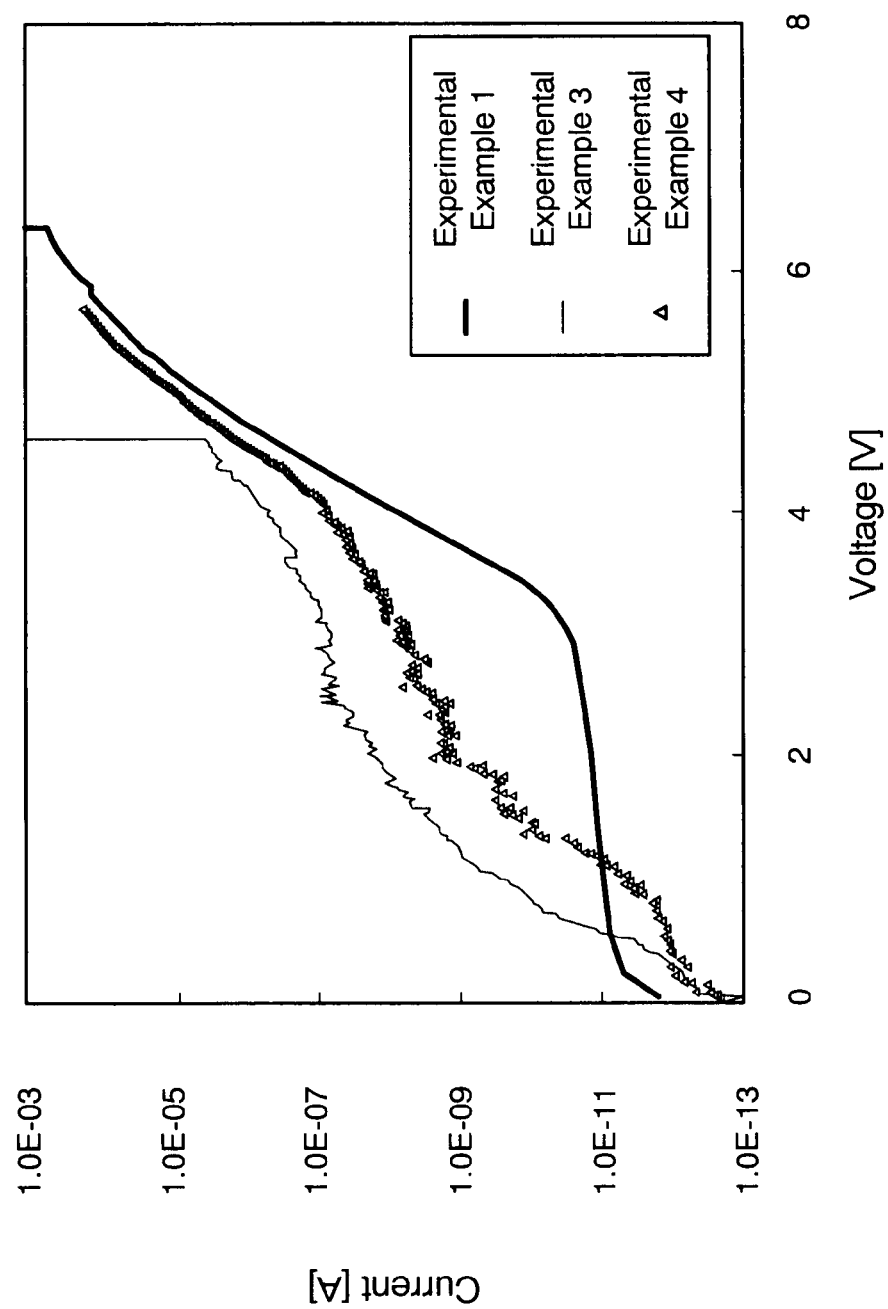
FIG. 5 is a graph showing the current-voltage characteristics of the MIS capacitors in the Example.

FIGS. 3 and 4 show the capacitance-voltage characteristics (CV characteristics) of the MIS capacitors in Experimental Examples 1 and 2, respectively, and FIG. 5 shows the current-voltage characteristic (IV characteristic) of the MIS capacitors in Experimental Examples 1, 3 and 4.

In FIG. 3, the experimental CV characteristic curve is matched with the ideal CV characteristic curve as the fitting curve which is calculated on the MIS capacitor in Experimental Example 1. Moreover, in FIG. 5, the experimental IV characteristic curves are matched with the theoretical FN tunneling current curves. Therefore, the LAO film of the MIS capacitor in Experimental Example 1 can exhibit satisfactory electrical insulation.

Referring to FIG. 4, the CV characteristic curve of the MIS capacitor in Experimental Example 2 exhibits different flat bands commensurate with the respective measuring frequencies, and is not matched with the ideal CV characteristic curve. As a result, the CV characteristic of the MIS capacitor in Experimental Example 2 is deteriorated. In comparison with the MIS capacitors in Experimental Examples 1 and 2, it is considered that the deterioration of the CV characteristic of the MIS transistor in Experimental Example 2 is caused by the oxygen defect which is originated from the shortness in supply of the oxygen raw material because only the $O_2$ partial pressure in Experimental Example 2 is different from the $O_2$ partial pressure in Experimental Example 1 while the supplying rates of the lanthanum raw material and the aluminum raw material in Experimental Example 2 are the same as the supplying rates of the lanthanum raw material and the aluminum raw material in Experimental Example 1. As a result, it is turned out that the $O_2$ partial pressure of $5\times10^{-7}$ Torr or over is required under the condition that the supplying rates of the lanthanum raw material and the aluminum raw material are set to $1\times10^{13}$ [$cm^{-2} \cdot s^{-1}$]. In other words, it is turned out that the $O_2$ partial pressure must be set sufficiently high in view of the ratio of the $O_2$ partial pressure to the supplying rate of the lanthanum raw material.

The supplying rates of the lanthanum raw material and the aluminum raw material are obtained as follows: First of all, the LAO film is analyzed by means of ICP (inductive coupling plasma) analysis so that the weights of the lanthanum component and the aluminum component in the LAO film are measured. Then, the weights of the lanthanum component and the aluminum component in the LAO film are divided by the lanthanum atomic weight and the aluminum atomic weight, respectively, so that the number of elemental lanthanum and the number of elemental aluminum per unit volume are obtained. Then, the number of elemental lanthanum and the number of elemental aluminum per unit volume are multiplied by the thickness of the LAO film and then, divided by the film forming period of time. As a result, the intended supplying rates of the lanthanum raw material and the aluminum raw material can be obtained.

Table 2 lists the electric characteristics of the MIS transistors in Experimental Examples 1 to 4.

TABLE 2

Result of electric characteristics

| No, | CV characteristic | IV characteristic |
|---|---|---|
| Experimental Example 1 | ○ | ○ |
| Experimental Example 2 | X | — |
| Experimental Example 3 | ○ | X |
| Experimental Example 4 | ○ | X |

Referring to Table 2, the MIS transistor with the LAO film in Experimental Example 1 can exhibit the satisfactory CV characteristic and IV characteristic. In this point of view, the film forming condition is quantified so that the number of $O_2$ molecule in the oxygen raw material which is to be collided with the Si substrate and the numbers of $H_2O$ molecule, CO molecule and $CO_2$ molecule remaining in the atmosphere under the film forming process which are to be collided with the Si substrate can be calculated. As described above, each gas component is represented as unit of pressure (partial pressure), but the number of each gas component to be collided with the Si substrate per unit of time and unit of area can be calculated by "Hertz-Knudsen" equation:

$$J = 3.53 \times 10^{22} \times \frac{P}{\sqrt{MT}} \quad [cm^{-2} \cdot S^{-1}] \qquad (1)$$

P[Torr]: Pressure, M: Molecular weight, T[K]: Temperature

Therefore, the number of $O_2$ molecule which is to be collided with the Si substrate and the numbers of $H_2O$ molecule, CO molecule and $CO_2$ molecule which are to be collided with the Si substrate can be calculated from the equation (1) on Experimental Example 1. Table 3 lists the thus calculated number of $O_2$ molecule and the calculated numbers of $H_2O$ molecule, CO molecule and $CO_2$ molecule with the number of lanthanum atom in the lanthanum raw material and the number of aluminum atom in the aluminum raw material. In equation (1), since each gas component such as $O_2$ gas is full in the film forming chamber 1 and contacted with the Si substrate, the distance between the Si substrate and the gas source of each gas component such as $O_2$ gas is not considered as a parameter.

insulation of the lanthanum oxide compound film (LAO film). As a result, the numbers of $H_2O$ molecule, CO molecule and $CO_2$ molecule listed in Table 3 correspond to the upper limited values for realizing the satisfactory electric characteristics listed in Table 2 under the condition that the number of $O_2$ molecule is set to the lower limited value for the same reason.

On the other hand, in order to manufacture the lanthanum oxide compound film with satisfactory electrical insulation due to the high dielectric constant stably at high yield ratio, it is required to increase the $O_2$ partial pressure. Therefore, the upper limited value of the $O_2$ partial pressure may be set to $1 \times 10^{-4}$ Torr in view of the consumption of the oxygen raw material at the ion gauge installed in the film forming chamber 1, the Si substrate and the heater which is to be oxidized by the $O_2$ molecules in the oxygen raw material. In this case, the number of $O_2$ molecule to be collided with the Si substrate can be calculated as $4 \times 10^{16}$ by using the equation (1) in the same manner as Table 3, and then, standardized as 4000 by the numbers of lanthanum atom and aluminum atom ($=1 \times 10^{13}$). In other words, the upper limited value of the number of $O_2$

TABLE 3

| Unit | Number of atom or molecule to be collided with substrate | | | | | |
|---|---|---|---|---|---|---|
| | Al | La | $O_2$ | $H_2O$ | CO | $CO_2$ |
| Degree of vacuum [Torr] | — | — | $5 \times 10^{-7}$ | $1 \times 10^{-8}$ | $5 \times 10^{-9}$ | $3 \times 10^{-9}$ |
| Number of atom or molecule [$cm^{-2} \cdot s^{-1}$] | $1 \times 10^{13}$ | $1 \times 10^{13}$ | $2 \times 10^{14}$ | $5 \times 10^{12}$ | $2 \times 10^{12}$ | $1 \times 10^{12}$ |

Referring to Table 3, the ratios of the numbers of $H_2O$ molecule, CO molecule and $CO_2$ molecule to the numbers of lanthanum atom and aluminum atom can be calculated, respectively. In this case, the numbers of $H_2O$ molecule, CO molecule and $CO_2$ molecule are divided by the numbers of lanthanum atom and aluminum atom and thus, standardized by the numbers of lanthanum atom and aluminum atom (which are defined as "1"). Table 4 lists the thus calculated results.

TABLE 4

| Unit | Ratio of $O_2$ molecule, $H_2O$ molecule, CO molecule and $CO_2$ molecule to lanthanum atom and aluminum atom | | | | | |
|---|---|---|---|---|---|---|
| | Al | La | $O_2$ | $H_2O$ | CO | $CO_2$ |
| Number of atom or molecule [$cm^{-2} \cdot s^{-1}$] | 1 | 1 | 20 | 1/2 | 1/5 | 1/10 |

As described above, the number of $O_2$ molecule represents the lower limited value for realizing the satisfactory electric characteristics such as the CV characteristic and the IV characteristic. Then, the numbers of $H_2O$ molecule, CO molecule and $CO_2$ molecule are originated from the $H_2O$ molecules, the CO molecules and the $CO_2$ molecules remaining in the atmosphere under the film forming process and thus, not originated from the respective raw material gases for forming the intended lanthanum oxide compound film (LAO film). In this point of view, the numbers of $H_2O$ molecule, CO molecule and $CO_2$ molecule should not be considered in view of the supplying rates of the lanthanum raw material and the aluminum raw material, but considered in view of the electrical molecule to be supplied to the Si substrate can be calculated as 4000 per one lanthanum atom.

As described above, on the other hand, the numbers of $H_2O$ molecule, CO molecule and $CO_2$ molecule are originated from the $H_2O$ molecules, the CO molecules and the $CO_2$ molecules remaining in the atmosphere under the film forming process and thus, not originated from the respective raw material gases for forming the intended lanthanum oxide compound film (LAO film). In this point of view, the numbers of $H_2O$ molecule, CO molecule and $CO_2$ molecule should not also be considered in view of the supplying rates of the lanthanum raw material and the aluminum raw material, but considered in view of the electrical insulation of the lanthanum oxide compound film (LAO film). As a result, even though the upper limited value of the number of $O_2$ molecule is set to 4000, it also is required that the number of $H_2O$ molecule, the number of CO molecule and the number $CO_2$ molecule are set to one-half or less, one-fifth or less and one-tenth or less per one lanthanum atom, respectively, in the atmosphere under the film forming process because the numbers of $H_2O$ molecule and the like are not increased when the number Of $O_2$ molecule in the oxygen raw material is increased and the $H_2O$ molecules, the CO molecules and the CO molecules remain in the atmosphere under the film forming process and are absorbed to the lanthanum oxide compound film under manufacture so as to deteriorate the electric characteristics of the intended lanthanum oxide compound film.

Figure 6:
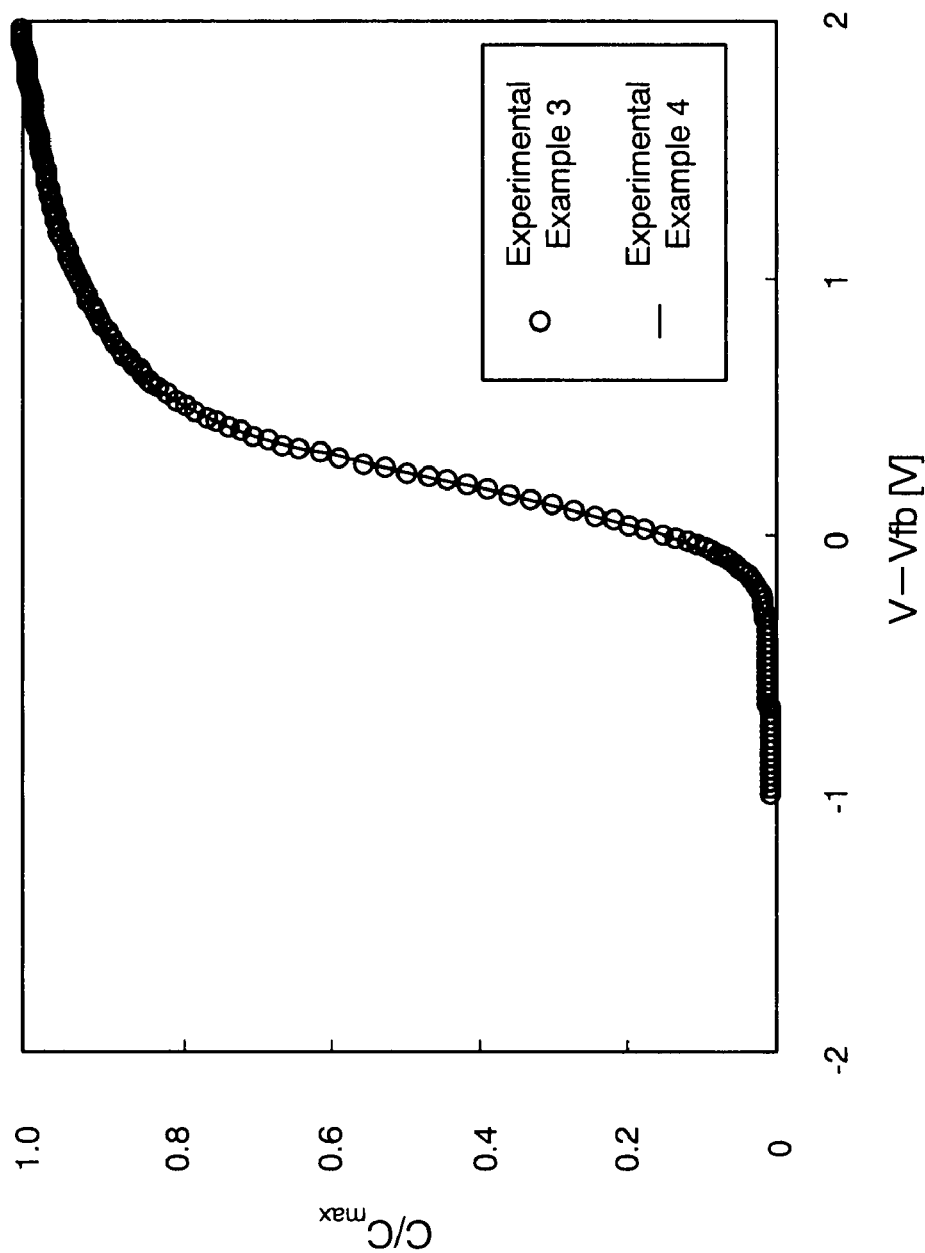
FIG. 6 is a graph showing the capacitance-voltage characteristics of the MIS capacitors in the Example.

FIG. 6 shows the capacitance-voltage characteristics (CV characteristics) of the MIS transistors in Experimental Examples 3 and 4. Referring to FIG. 6, the experimental CV characteristics curves are matched with the calculated ideal CV characteristic curve. Therefore, it is turned out that the MIS transistors in Experimental Examples 3 and 4 can exhibit the satisfactory electric characteristics.

Referring to the IV characteristic curves in FIG. 5, in contrast, the leak currents of the MIS transistors in Experimental Examples 3 and 4 become much larger than the leak current of the MIS transistor in Experimental Example 1, which is originated from that in Experimental Example 1, the number of $H_2O$ molecule, the number of CO molecule and the number $CO_2$ molecule are set to one-half, one-fifth and one-tenth per one lanthanum atom, respectively, and in Experimental Examples 3 and 4, the number of $H_2O$ molecule, the number of CO molecule and the number $CO_2$ molecule are set beyond one-half, one-fifth and one-tenth per one lanthanum atom, respectively. In other words, since the number of $H_2O$ molecule, the number of CO molecule and the number $CO_2$ molecule are set beyond the corresponding upper limited values in Experimental Examples 3 and 4, the IV characteristics of the corresponding MIS transistors are deteriorated so that the large leak currents are generated from the corresponding MIS transistors (refer to Tables). It is turned out from the HRBS (High-resolution Rutherford Back Scattering) analysis for the LAO films that the carbon content in the LAO film obtained in Experimental Example 1 is lower than the carbon contents in the LAO films obtained in Experimental Examples 3 and 4.

It may be considered that the carbon component of the LAO film is originated from the CO gas component and the $CO_2$ gas component remaining in the atmosphere under film forming process. Namely, it may be considered that the CO gas component and the $CO_2$ gas component remaining in the atmosphere are incorporated into the LAO film under manufacture because the lanthanum atoms in the lanthanum raw material not reacted with the $O_2$ molecules in the oxygen raw material may be reacted with the $H_2O$ molecules, the CO molecules and the $CO_2$ molecules remaining in the atmosphere so as to generate a lanthanum hydroxide and a lanthanum carbonate. In this point of view, since the number of $H_2O$ molecule, the number of CO molecule and the number $CO_2$ molecule in Experimental Examples 3 and 4 are set larger than the number of $H_2O$ molecule, the number of CO molecule and the number $CO_2$ molecule in Experimental Example 1, the generation ratio of the lanthanum hydroxide and the lanthanum carbonate in Experimental Examples 3 and 4 may be larger than the generation ratio of the lanthanum hydroxide and the lanthanum carbonate in Experimental Example 1, thereby deteriorating the electrical insulation of the LAO films obtained in Experimental Examples 3 and 4 and thus, increasing the leak currents of the MIS transistors containing the LAO films.

Generally, the $H_2O$ molecules, the CO molecules and the $CO_2$ molecules function as pro-oxidants, respectively, in the formation of a silicon oxide film and an aluminum oxide film. However, it is turned out that the $H_2O$ molecules, the CO molecules and the $CO_2$ molecules deteriorate the LAO film.

In Experimental Example 2, the number of $H_2O$ molecule, the number of CO molecule and the number of $CO_2$ molecule are set to the corresponding upper limited values of one-half, one-fifth and one-tenth per one lanthanum atom, respectively, but the number of $O_2$ molecule is set smaller than the corresponding lower limited value of 20 (refer to Tables).

In Experimental Examples, the lanthanum raw material is supplied from the corresponding K-cell, but the aluminum raw material, the titanium raw material and the like may be supplied from the corresponding electron beam deposition sources.

Moreover, in Experimental Examples, the LAO film is manufactured, but another lanthanum oxide compound film may be manufactured by replacing the aluminum component of the lanthanum oxide compound film with another component such as hafnium, zirconium and titanium. In these cases, the electric characteristics of the thus obtained MIS transistor with the corresponding lanthanum oxide compound film depends on the number of $H_2O$ molecule, the number of CO molecule, the number of $CO_2$ molecule and the number of $O_2$ molecule in the same manner as described above. Namely, if the lanthanum oxide compound film incorporates the $H_2O$ molecules, the CO molecules and the $CO_2$ molecules remaining in the atmosphere, the electric characteristics of the lanthanum oxide compound film may be deteriorated, which is characterized in the lanthanum oxide compound film.

In the case of manufacturing the LAO film, the radical oxygen raw material and the ozone raw material may be employed instead of the oxygen raw material gas. Since the oxidizabilities of the radical oxygen raw material and the ozone raw material are higher than the oxidizability of the oxygen raw material gas, the same function/effect as describe above may be obtained even though the partial pressure of the radical oxygen raw material or the ozone raw material is set smaller than $5 \times 10^{-7}$ Torr because the generation ratio of oxygen defect can be lowered at the lower partial pressure.

In the use of the LAO film, the multilayered structure of an alumina film and the LAO film can be easily formed. For example, first of all, the aluminum raw material is supplied with the oxygen raw material under the condition that the shutter for the K-cell of the lanthanum raw material is closed so as to form the aluminum film, and then, the lanthanum raw material is supplied by opening the shutter for the corresponding K-cell so as to form the LAO film. In the MBE apparatus shown in FIG. 1, since the hafnium raw material can be supplied by means of electron beam deposition, the multilayered structure of an hafnium oxide film and the LAO film can be formed.

Another lanthanoid may be employed so as to form anther aluminate film or hafnate film. In this case, the aluminate film and the hafnate film with another lanthanoid can be manufactured in the same manner as the LAO film by controlling the temperatures of the corresponding K-cells because the lanthanoid raw material is likely to be supplied at high temperature as the lanthanum raw material. In this point off view, the lanthanum oxide compound may contain another lanthanoid in addition to lanthanum (La).

In Experimental Examples, the Si substrate is employed, but another semiconductor substrate or another substrate commercially available except the semiconductor substrate may be employed.

Then, a MONOS memory will be described as a practical device using the lanthanum oxide compound film obtained as described above.

Figure 7:
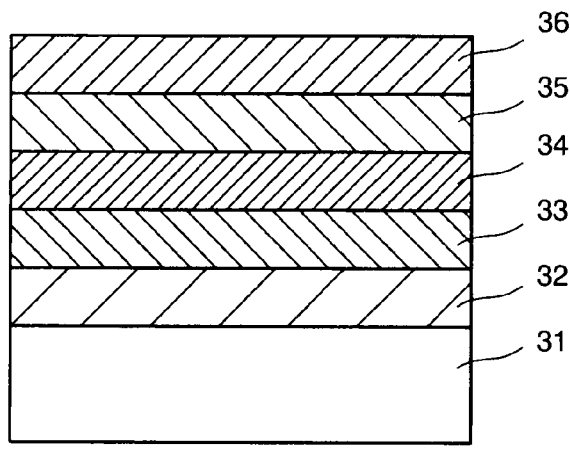
FIG. 7 is a cross sectional view showing a step in a method for manufacturing a MONOS memory.

FIGS. 7 to 11 are cross sectional views for explaining the manufacturing process of the MONOS memory in this embodiment. First of all, as shown in FIG. 7, a silicon oxynitride film 32 is formed as a tunneling insulating layer in a thickness of e.g., 5 nm on a Si substrate 31, and then, a silicon nitride layer 33 is formed as an electric charge storage layer in a thickness of e.g., 5 nm by means of CVD method, and then, an aluminum oxide layer 34 is formed as a block insulating layer in a thickness of e.g., 5 nm by means of CVD method. Thereafter, a lanthanum aluminate layer 35 is formed in a thickness of e.g., 5 nm by means of MBE method as described above, and then, a tantalum nitride layer 36 is formed as a controlling gate electrode by means of sputtering.

In this embodiment, after the aluminum oxide layer 34 is formed, the thus obtained layered structure is heated at a temperature of 1000° C. so as to stabilize the aluminum oxide layer 34, and then, the lanthanum aluminate layer 35 is formed on the aluminum oxide layer 34. In this case, the reaction between the silicon nitride layer 33 as the electric charge storage layer and the lanthanum aluminate layer 35 can be prevented.

Figure 8:
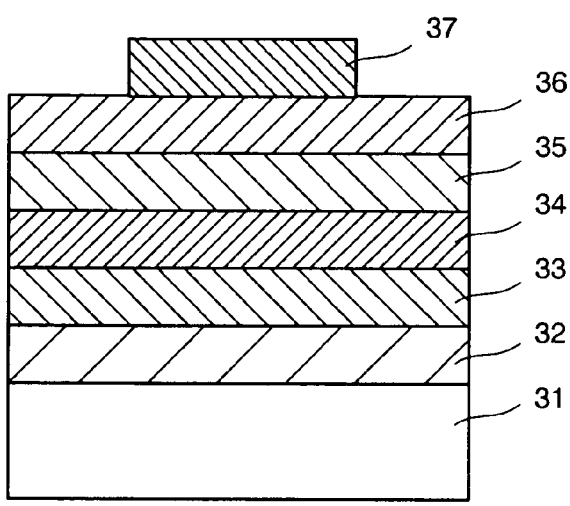
FIG. 8 is a cross sectional view showing a step after the step shown in FIG. 7.
Figure 9:
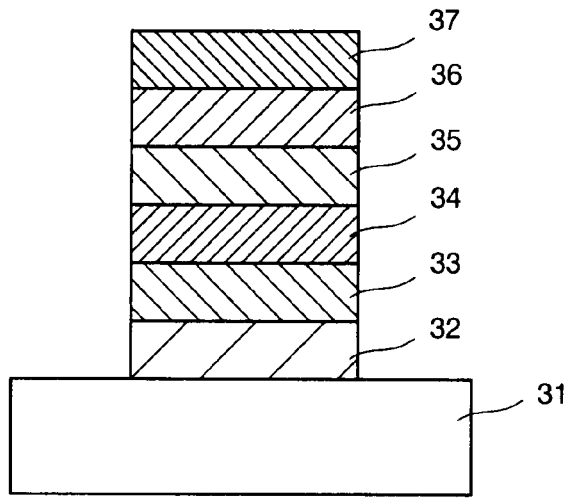
FIG. 9 is a cross sectional view showing a step after the step shown in FIG. 8.
Figure 10:
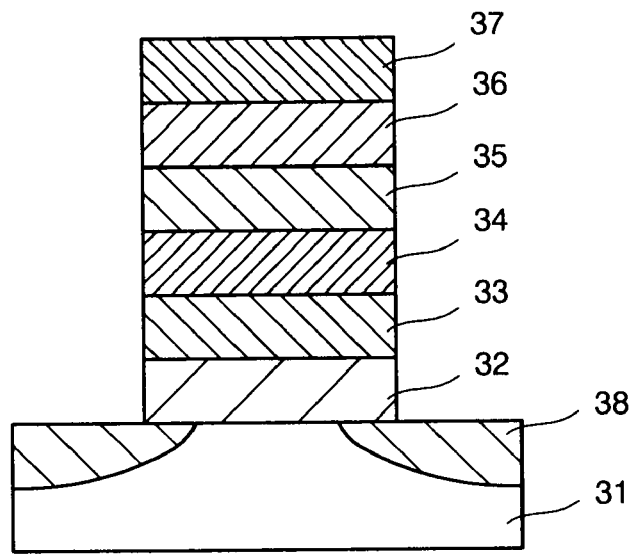
FIG. 10 is a cross sectional view showing a step after the step shown in FIG. 9.
Figure 11:
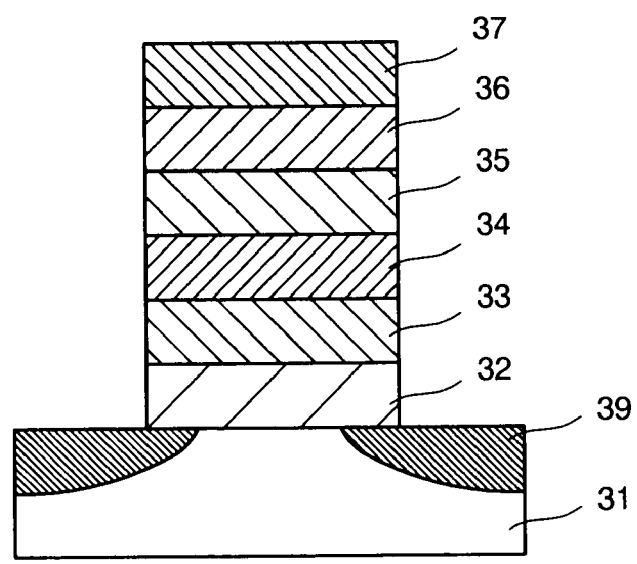
FIG. 11 is a cross sectional view showing a step after the step shown in FIG. 10.

Then, as shown in FIG. 8, a mask 37 is formed on the tantalum nitride layer 36 so that the tantalum nitride layer 36 through the silicon oxynitride layer 32 are etched in the layered direction by means of ion etching so as to partially expose the surface of the Si substrate 31 (FIG. 9). Then, as shown in FIG. 10, phosphor ions are implanted as donor impurities into the Si substrate 31 so as to form the ion implantation region 38. The ion implantation region 38 is activated through the thermal treatment at a temperature of 900° C. so as to be converted into the corresponding activation region 39. In this way, the intended MONOS memory can be manufactured.

Although the present invention was described in detail with reference to the above examples, this invention is not limited to the above disclosure and every kind of variation and modification may be made without departing from the scope of the present invention.

What is claimed is:

1. A method for manufacturing a lanthanum aluminum oxide compound on a substrate, comprising:
setting a number of $H_2O$ molecule, a number of CO molecule and a number of $CO_2$ molecule to one-half or less, one-fifth or less and one-tenth or less per one lanthanum atom, respectively, in an atmosphere;
heating a lanthanum raw material in a first Knudsen cell at a first temperature of 900° C. or over to degas from the lanthanum raw material;
heating an aluminum raw material in a second Knudsen cell at a second temperature from 800 to 1200° C. to degas from the aluminum raw material; and
supplying the lanthanum raw material, the aluminum raw material, and an oxygen raw material gas simultaneously to the substrate under a condition that a number of $O_2$ molecule is set to 20 or more per one lanthanum atom to manufacture the lanthanum aluminum oxide compound on the substrate, wherein the lanthanum raw material is supplied by molecular beam epitaxy method by heating the lanthanum raw material in the first Knudsen cell at a temperature higher than the first temperature, and the aluminum raw material is supplied by molecular beam epitaxy method by heating the aluminum raw material in the second Knudsen cell at a temperature higher than the second temperature.

2. The method according to claim 1,
wherein said oxygen raw material gas comprises at least one of an oxygen radical and an ozone.

3. The method according to claim 1, further comprising:
heating said substrate at a temperature of 100° C. or over before said lanthanum aluminum oxide compound is manufactured on said substrate.

4. The method according claim 1,
wherein the aluminum raw material is supplied to said substrate under a condition that the temperature of an opening of said second Knudsen cell is set higher than the temperature of a bottom portion of said second Knudsen cell.

5. The method according to claim 1,
wherein the aluminum raw material is supplied to said substrate under the condition that an opening of said second Knudsen cell is narrowed.

6. The method according to claim 1, further comprising:
holding said substrate with a holder made of Inconel.

7. The method according to claim 6,
wherein a holding portion of said holder which is contacted with said substrate comprises at least one of aluminum oxide and silicon oxide.

8. The method according to claim 1,
wherein said substrate is a semiconductor substrate.

9. The method according to claim 8,
wherein said semiconductor substrate is a silicon substrate.

10. The method according to claim 1, comprising setting the temperatures of the lanthanum raw materials and aluminum raw material by setting the temperatures of the Knudsen cells.

11. The method according to claim 1, wherein a shutter controls supplying the lanthanum material to the substrate.

12. The method according to claim 1, wherein a partial pressure of $O_2$ is $5\times10^{-7}$ Torr or higher.

* * * * *